(12) United States Patent
Hosokawa et al.

(10) Patent No.: US 11,133,428 B2
(45) Date of Patent: Sep. 28, 2021

(54) LIGHT ABSORPTION LAYER, DISPERSION, PHOTOELECTRIC CONVERSION ELEMENT, SOLAR CELL, AND METHOD FOR MANUFACTURING LIGHT ABSORPTION LAYER

(71) Applicant: KAO CORPORATION, Tokyo (JP)

(72) Inventors: Hiroji Hosokawa, Wakayama (JP);
Takuya Sawada, Wakayama (JP);
Yohei Shiraishi, Osaka (JP)

(73) Assignee: KAO CORPORATION, Tokyo (JP)

( * ) Notice: Subject to any disclaimer, the term of this patent is extended or adjusted under 35 U.S.C. 154(b) by 0 days.

(21) Appl. No.: 16/318,633

(22) PCT Filed: Mar. 30, 2017

(86) PCT No.: PCT/JP2017/013455
§ 371 (c)(1),
(2) Date: Jan. 17, 2019

(87) PCT Pub. No.: WO2018/025445
PCT Pub. Date: Feb. 8, 2018

(65) Prior Publication Data
US 2019/0165192 A1    May 30, 2019

(30) Foreign Application Priority Data

Aug. 4, 2016    (WO) .................. PCT/JP2016/072968

(51) Int. Cl.
*H01L 31/0352* (2006.01)
*H01L 51/44* (2006.01)
(Continued)

(52) U.S. Cl.
CPC .... *H01L 31/035218* (2013.01); *H01L 31/054* (2014.12); *H01L 51/426* (2013.01);
(Continued)

(58) Field of Classification Search
CPC ........... H01L 31/035218; H01L 31/054; H01L 51/44; H01L 51/444; H01L 51/447
See application file for complete search history.

(56) References Cited

U.S. PATENT DOCUMENTS

2015/0228415 A1    8/2015    Seok et al.
2015/0249170 A1    9/2015    Snaith et al.
(Continued)

FOREIGN PATENT DOCUMENTS

CN    104183704 A    12/2014
JP    2014-49631 A    3/2014
(Continued)

OTHER PUBLICATIONS

International Preliminary Report on Patentability and the English translation of the Written Opinion of the International Searching Authority (Forms PCT/IB/338, PCT/IB/373 and PCT/ISA237), dated Feb. 14, 2019, for International Application No. PCT/JP2017/013455.

(Continued)

*Primary Examiner* — Golam Mowla
(74) *Attorney, Agent, or Firm* — Birch, Stewart, Kolasch & Birch, LLP (57) ABSTRACT

The present invention pertains to a light absorption layer for forming a solar cell and a photoelectric conversion element having excellent durability and photoelectric conversion efficiency in the near infrared region, and a solar cell and a photoelectric conversion element having the light absorption layer. This light absorption layer contains a perovskite compound having a band gap energy of 1.7-4.0 eV, and a quantum dot having a band gap energy equal to or higher than 0.2 eV and equal to or lower than the band gap energy of the perovskite compound.

14 Claims, 1 Drawing Sheet

(51) Int. Cl.
*H01L 51/42* (2006.01)
*H01L 31/054* (2014.01)

(52) U.S. Cl.
CPC ............ *H01L 51/44* (2013.01); *H01L 51/444* (2013.01); *H01L 51/447* (2013.01); *Y02E 10/549* (2013.01)

(56) References Cited

U.S. PATENT DOCUMENTS

| | | | |
|---|---|---|---|
| 2016/0133392 A1 | 5/2016 | Sato et al. | |
| 2016/0380136 A1* | 12/2016 | Ning | C04B 35/5152 252/519.4 |
| 2018/0315870 A1 | 11/2018 | Snaith et al. | |

FOREIGN PATENT DOCUMENTS

| | | | |
|---|---|---|---|
| JP | 2015-535390 A | 12/2015 | |
| JP | 2016-9737 A | 1/2016 | |
| KR | 10-2014-0035284 A | 3/2014 | |
| WO | WO 2015/092397 A1 | 6/2015 | |
| WO | WO 2016/109902 A2 | 7/2016 | |

OTHER PUBLICATIONS

Ning et al., "Quantum-dot-in-perovskite solids", Nature, vol. 523, Jul. 16, 2015, pp. 324-328 (18 pages).

Dirin et al., "Lead Halide Perovskites and Other Metal Halide Complexes As Inorganic Capping Ligands for Colloidal Nanocrystals", JACS, Apr. 18, 2014, vol. 136, p. 6550-6553.

Hu et al., "Quantitative Analysis of Trap-State-Mediated Exciton Transport in Perovskite-Shelled PbS Quantum Dot Thin Films Using Photocarrier Diffusion-Wave Nondestructive Evaluation and Imaging", The Journal of Physical Chemistry, Jun. 22, 2016, vol. 120, p. 14416-14427.

International Search Report, issued in PCT/JP2017/013455, PCT/ISA/210, dated Jun. 13, 2017.

Kojima et al., "Organometal Halide Perovskites as Visible-Light Sensitizers for Photovoltaic Cells", J. Am. Chem. Soc., 2009, vol. 131, p. 6050-6051.

Hong Noh et al., "Chemical Management for Colorful, Efficient, and Stable Inorganic-Organic Hybrid Nanostructured Solar Cells", ACS, Nano Letters, Mar. 21, 2013, vol. 13, p. 1764-1769.

Written Opinion of the international Searching Authority, issued in PCT/JP2017/013455, PCT/ISA/237, dated Jun. 13, 2017.

Yang et al., Colloidal Quantum Dot Photovoltaics Enhanced by Perovskite Shelling, ACS, Nano Letters, Oct. 6, 2015, vol. 15, p. 7539-7543.

Zhang et al., "Diffusion-Controlled Synthesis of PbS and PbSe Quantum Dots with in Situ Halide Passivation for Quantum Dot Solar Cells", ACS Nano, 2014, vol. 8, No. 1, p. 614-622.

Extended European Search Report, dated Jun. 16, 2000 for European Application No. 17836552.4.

English translation of the Chinese Search Report, dated Sep. 15, 2020, for Chinese Application No. 201780028015.0.

* cited by examiner

LIGHT ABSORPTION LAYER, DISPERSION, PHOTOELECTRIC CONVERSION ELEMENT, SOLAR CELL, AND METHOD FOR MANUFACTURING LIGHT ABSORPTION LAYER

TECHNICAL FIELD

The present invention relates to a light absorption layer, a photoelectric conversion element having the light absorption layer, and a solar cell having the photoelectric conversion element.

BACKGROUND ART

A photoelectric conversion element that converts light energy into electric energy is used for solar cells, optical sensors, copying machines, and the like. In particular, from the viewpoint of environmental and energy problems, photoelectric conversion elements (solar cells) utilizing sunlight that is an inexhaustible clean energy attract attention.

Since general silicon solar cells utilize ultra-high purity silicon and are manufactured by "dry process" such as epitaxial crystal growth under high vacuum, it is not possible to expect a large cost reduction. Therefore, a solar cell manufactured by a "wet process" such as a coating process is expected as a low-cost next generation solar cell.

A quantum dot solar cell is a next-generation solar cell that can be manufactured by the "wet process". The quantum dot is an inorganic nanoparticle having a particle size of about 20 nm or less and exhibits physical properties different from those of bulk bodies due to the expression of quantum size effect. For example, it is known that the band gap energy increases (shortening of the absorption wavelength) as the particle size of quantum dots decreases, and lead sulfide (PbS) quantum dots having a particle size of about 3 nm and a band gap energy of about 1.2 eV have been reported for use in quantum dot solar cells (ACS Nano 2014, 8, 614-622).

In addition, there is a perovskite solar cell as the most promising candidate for the next generation solar cell, which has been recently reported to show a rapid increase in photoelectric conversion efficiency. This perovskite solar cell is provided with a photoelectric conversion element using a perovskite compound ($CH_3NH_3PbI_3$) composed of a cation (such as methyl ammonium) and a halogenated metal salt (such as lead iodide) for the light absorption layer (J. Am. Chem. Soc. 2009, 131, 6050-6051). It is known that the chemical and physical properties of the perovskite compound change depending on the composition of the cationic species, halogen element, metal element and the like. For example, substitution of halogen element iodine with bromine improves the durability of the photoelectric conversion element, but a reduction in conversion efficiency accompanying the shortening of absorption wavelength (increase of band gap energy) of the perovskite compound has been reported (Nano Lett. 2013, 13, 1764-1769).

Further, quantum dot solar cells using a PbS quantum dot surface-treated with an iodine-based perovskite ($CH_3NH_3PbI_3$) as a light absorption layer have been reported (Nano Lett. 2015, 15, 7539-7543).

SUMMARY OF THE INVENTION

However, in the conventional photoelectric conversion element, excellent durability and high conversion efficiency are not compatible. For example, since quantum dots are easily surface-oxidized in the atmosphere, the photoelectric conversion efficiency decreases with the lapse of time, and the durability is poor. In addition, since the perovskite compound is decomposed by moisture in the atmosphere, it has a problem in durability. When the halogen composition of the perovskite compound is replaced with bromine from iodine, the durability improves, but the photoelectric conversion efficiency (quantum efficiency) in the near-infrared light region is remarkably lowered according to the shortening of absorption wavelength of the perovskite compound (increase of band gap energy).

The present invention relates to a light absorption layer for forming a photoelectric conversion element and a solar cell excellent in durability and photoelectric conversion efficiency in a near-infrared light region, and a photoelectric conversion element and a solar cell each having the light absorption layer.

By using a light absorption layer containing a perovskite compound having a specific band gap energy and a quantum dot having a specific band gap energy, the present inventors have found that the durability of the photoelectric conversion element and the photoelectric conversion efficiency (quantum efficiency) in the near-infrared light region have been both improved.

The present invention is related to a light absorption layer containing a perovskite compound having a band gap energy of 1.7 eV or more and 4.0 eV or less and a quantum dot having a band gap energy equal to or more than 0.2 eV and equal to or less than the band gap energy of the perovskite compound.

By using a perovskite compound (for example, $CH_3NH_3PbBr_3$) having a band gap energy of 1.7 eV or more and 4.0 eV or less and a quantum dot having a band gap energy equal to or more than 0.2 eV and equal to or less than the band gap energy of the perovskite compound (for example, PbS quantum dots) as a material for forming the light absorption layer, light in a wide wavelength region including a long wavelength region such as near infrared that can be absorbed by quantum dots can be absorbed, in addition to light in a short wavelength region that the perovskite compound can absorb, so that it is possible to obtain a photoelectric conversion element having a photoelectric conversion function in a wide wavelength region.

The perovskite compound (for example, $CH_3NH_3PbBr_3$) having a band gap energy of 1.7 or more and 4.0 eV or less has a more excellent durability (moisture resistance) as compared with a perovskite compound (for example, $CH_3NH_3PbI_3$) having a band gap energy of less than 1.7 eV, but such durability is insufficient for practical use. The quantum dots (for example, PbS quantum dots) having a band gap energy equal to or more than 0.2 eV and equal to or less than the band gap energy of the perovskite compound also have insufficient durability (oxidation resistance).

However, by combining the perovskite compound having a band gap energy of 1.7 eV or more and 4.0 eV or less with the quantum dot having a band gap energy equal to or more than 0.2 eV and equal to or less than the band gap energy of the perovskite compound, the durability of the photoelectric conversion element was surprisingly improved. The reason is not clear, but it is presumed as follows. As a mechanism of durability deterioration of the perovskite compound, it is presumed that the perovskite compound is decomposed (for example, $CH_3NH_3PbBr_3 \rightarrow CH_3NH_3Br+PbBr_2$) by moisture in the atmosphere. It is inferred that by combining the perovskite compound and the quantum dots, the quantum dots interact with the perovskite compound, whereby the crystal structure of the perovskite compound is stabilized to suppress the hydrolysis reaction of the perovskite compound, so that the durability of the photoelectric conversion element is improved. Furthermore, since the perovskite compound is present on the surface of the quantum dots, oxidation of the surface of the quantum dots is suppressed, it is inferred that the durability of the photoelectric conversion element is improved.

Further, by combining the perovskite compound having a band gap energy of 1.7 eV or more and 4.0 eV or less and the quantum dot having a band gap energy equal to or more than 0.2 eV and equal to or less than the band gap energy of the perovskite compound, the photoelectric conversion efficiency of the photoelectric conversion element was surprisingly improved with time (storage). Although the reason is not clear, it is presumed that the interaction between the perovskite compound and the quantum dot reduces the carrier deactivation site existing at the interface between the perovskite compound and the quantum dot, and the photoelectric conversion efficiency is improved because of reduced resistance.

According to the present invention, a photoelectric conversion element and a solar cell excellent in durability and photoelectric conversion efficiency in the near-infrared light region can be obtained.

MODE FOR CARRYING OUT THE INVENTION

<Light Absorption Layer>

The light absorption layer of the present invention contains, as light absorbing agents, a perovskite compound having a band gap energy of 1.7 eV or more and 4.0 eV or less and a quantum dot having a band gap energy equal to or more than 0.2 eV and equal to or less than the maximum value of the band gap energy of the perovskite compound. The light absorption layer of the present invention may contain other light absorbing agents other than those mentioned above as long as the effect of the present invention is not impaired.

The light absorption layer contributes to charge separation of the photoelectric conversion element and has a function of transporting respectively electrons and holes generated by light absorption toward electrodes in the opposite directions and is also called as a charge separation layer or a photoelectric conversion layer.

The perovskite compound is a compound having a perovskite type crystal structure, and from the viewpoint of improving durability (moisture resistance) and photoelectric conversion efficiency, a perovskite compound having a band gap energy of 1.7 eV or more and 4.0 eV or less is used. The perovskite compound may be used singly or in combination of two or more kinds having different band gap energies.

From the viewpoint of improving the photoelectric conversion efficiency (voltage), the band gap energy of the perovskite compound is preferably 2.0 eV or more, more preferably 2.1 eV or more, still more preferably 2.2 eV or more, and from the viewpoint of improving the photoelectric conversion efficiency (current), the band gap energy of the perovskite compound is preferably 3.6 eV or less, more preferably 3.0 eV or less, still more preferably 2.4 eV or less. The band gap energies of the perovskite compound and the quantum dot can be determined from the absorption spectrum measured at 25° C. by the method described in Examples described later. The wavelength corresponding to the band gap energy determined from the absorption spectrum is called an absorption edge wavelength.

The perovskite compound is not limited as long as it has the band gap energy and known ones can be used without any particular limitation, but it is preferable to use one or more kinds selected from a compound represented by the following general formula (1) and a compound represented by the following general formula (2). From the viewpoint of achieving both durability and photoelectric conversion efficiency, a compound represented by the following general formula (1) is more preferable.

$$RMX_3 \tag{1}$$

(R is a monovalent cation, M is a divalent metal cation, and X is a halogen anion.)

$$R^1R^2R^3_{n-1}M_nX_{3n+1} \tag{2}$$

($R^1$, $R^2$ and $R^3$ are each independently a monovalent cation, M is a divalent metal cation, X is a halogen anion, and n is an integer of 1 to 10.)

The R is a monovalent cation, for example, a cation of the group 1 of the periodic table and includes an organic cation. Examples of the cation of the group 1 of the periodic table include $Li^+$, $Na^+$, $K^+$, and $Cs^+$. Examples of the organic cation include an ammonium ion which may have a substituent and a phosphonium ion which may have a substituent. There is no particular limitation on the substituent. Examples of the optionally substituted ammonium ion include an alkylammonium ion, a formamidinium ion and an arylammonium ion, and from the viewpoint of achieving both durability and photoelectric conversion efficiency, the optionally substituted ammonium ion is preferably one or more kinds selected from an alkyl ammonium ion and a formamidinium ion, more preferably one or more kinds selected from a monoalkylammonium ion and a formamidinium ion, still more preferably one or more kinds selected from a methylammonium ion, an ethylammonium ion, a butylammonium ion and a formamidinium ion, and even still more preferably a methylammonium ion.

Each of $R^2$, $R^2$, and $R^3$ mentioned above is independently a monovalent cation, and any or all of $R^1$, $R^2$, and $R^3$ may be the same. For example, examples of the monovalent cation include a cation of the group 1 of the periodic table and an organic cation. Examples of the cation of the group 1 of the periodic table include $Li^+$, $Na^+$, $K^+$, and $Cs^+$. Examples of the organic cation include an ammonium ion which may have a substituent and a phosphonium ion which may have a substituent. There is no particular restriction on the substituent. Examples of the optionally substituted ammonium ion include an alkylammonium ion, a formamidinium ion and an arylammonium ion, and from the viewpoint of achieving both durability and photoelectric conversion efficiency, the optionally substituted ammonium ion is preferably one or more kinds selected from an alkyl ammonium ion and a formamidinium ion, more preferably a monoalkylammonium ion, still more preferably one or more kinds selected from a methylammonium ion, an ethylammonium ion, a butylammonium ion, a hexylammonium ion, an octylammonium ion, a decylammonium ion, a dodecyl ammonium ion, a tetradecyl ammonium ion, a hexadecyl ammonium ion, and an octadecyl ammonium ion.

The n is an integer of 1 to 10 and from the viewpoint of achieving both durability and photoelectric conversion efficiency, n is preferably 1 to 4.

The M is a divalent metal cation and includes, for example, $Pb^{2+}$, $Sn^{2+}$, $Hg^{2+}$, $Cd^{2+}$, $Zn^{2+}$, $Mn^{2+}$, $Cu^{2+}$, $Ni^{2+}$, $Fe^{2+}$, $Co^{2+}$, $Pd^{2+}$, $Ge^{2+}$, $Y^{2+}$, and $Eu^{2+}$. From the viewpoint of excellent durability (moisture resistance) and photoelectric conversion efficiency, the M is preferably $Pb^{2+}$, $Sn^{2+}$, or $Ge^{2+}$, more preferably $Pb^{2+}$ or $Sn^{2+}$, still more preferably $Pb^{2+}$.

The X is a halogen anion, and examples thereof include a fluorine anion, a chlorine anion, a bromine anion, and an iodine anion. In order to obtain a perovskite compound having a desired band gap energy, the X is preferably a fluorine anion, a chlorine anion or a bromine anion, more preferably a chlorine anion or a bromine anion, still more preferably a bromine anion.

Examples of the compound represented by the general formula (1) having a band gap energy of 1.7 eV or more and 4.0 eV or less include $CH_3NH_3PbCl_3$, $CH_3NH_3PbBr_3$, $CH_3NH_3PbBrI_2$, $CH_3NH_3PbBr_2I$, $CH_3NH_3SnCl_3$, $CH_3NH_3SnBr_3$, $CH_3NH_3SnI_3$, $CH(=NH)NH_3PbCl_3$, and $CH(=NH)NH_3PbBr_3$. Among these, from the viewpoint of achieving both durability and photoelectric conversion efficiency at the same time, $CH_3NH_3PbBr_3$ and $CH(=NH)NH_3PbBr_3$ are preferable and $CH_3NH_3PbBr_3$ is more preferable.

Examples of the compound represented by the general formula (2) having a band gap energy of 1.7 eV or more and 4.0 eV or less include $(C_4H_9NH_3)_2PbI_4$, $(C_6H_{13}NH_3)_2PbI_4$, $(C_8H_{17}NH_3)_2PbI_4$, $(C_{10}H_{21}NH_3)_2PbI_4$, $(C_{12}H_{25}NH_3)_2PbI_4$, $(C_4H_9NH_3)_2(CH_3NH_3)Pb_2I_7$, $(C_6H_{13}NH_3)_2(CH_3NH_3)Pb_2I_7$, $(C_8H_{17}NH_3)_2(CH_3NH_3)Pb_2I_7$, $(C_{10}H_{21}NH_3)_2(CH_3NH_3)Pb_2I_7$, $(C_{12}H_{25}NH_3)_2(CH_3NH_3)Pb_2I_7$, $(C_4H_9NH_3)_2(CH_3NH_3)_2Pb_3I_{10}$, $(C_6H_{13}NH_3)_2(CH_3NH_3)_2Pb_3I_{10}$, $(C_8H_{17}NH_3)_2(CH_3NH_3)_2Pb_3I_{10}$, $(C_{10}H_{21}NH_3)_2(CH_3NH_3)_2Pb_3I_{10}$, $(C_{12}H_{25}NH_3)_2(CH_3NH_3)_2Pb_3I_{10}$, $(C_4H_9NH_3)_2PbBr_4$, $(C_6H_{13}NH_3)_2PbBr_4$, $(C_8H_{17}NH_3)_2PbBr_4$, $(C_{10}H_{21}NH_3)_2PbBr_4$, $(C_4H_9NH_3)_2(CH_3NH_3)Pb_2Br_7$, $(C_6H_{13}NH_3)_2(CH_3NH_3)Pb_2Br_7$, $(C_8H_{17}NH_3)_2(CH_3NH_3)Pb_2Br_7$, $(C_{10}H_{21}NH_3)_2(CH_3NH_3)Pb_2Br_7$, $(C_{12}H_{25}NH_3)_2(CH_3NH_3)Pb_2Br_7$, $(C_4H_9NH_3)_2(CH_3NH_3)_2Pb_3Br_{10}$, $(C_6H_{13}NH_3)_2(CH_3NH_3)_2Pb_3Br_{10}$, $(C_8H_{17}NH_3)_2(CH_3NH_3)_2Pb_3Br_{10}$, $(C_{10}H_{21}NH_3)_2(CH_3NH_3)_2Pb_3Br_{10}$, $(C_{12}H_{25}NH_3)_2(CH_3NH_3)_2Pb_3Br_{10}$, $(C_4H_9NH_3)_2(CH_3NH_3)_2Pb_3Cl_{10}$, $(C_6H_{13}NH_3)_2(CH_3NH_3)_2Pb_3Cl_{10}$, $(C_8H_{17}NH_3)_2(CH_3NH_3)_2Pb_3Cl_{10}$, $(C_{10}H_{21}NH_3)_2(CH_3NH_3)_2Pb_3Cl_{10}$, and $(C_{12}H_{25}NH_3)_2(CH_3NH_3)_2Pb_3Cl_{10}$.

The crystallite diameter of the perovskite compound of the light absorption layer is preferably 10 nm or more, more preferably 20 nm or more, still more preferably 40 nm or more, from the viewpoint of improving the photoelectric conversion efficiency and is preferably 1000 nm or less from the same viewpoint. The crystallite diameter of the light absorption layer in the range of 100 nm or less can be measured by the method described in Examples below. Further, the crystallite diameter in the range exceeding 100 nm cannot be measured by the method described in Examples described later but does not exceed the thickness of the light absorption layer.

The perovskite compound can be produced, for example, from a perovskite compound precursor as described later. As a precursor of the perovskite compound, for example, in the case where the perovskite compound is a compound represented by the general formula (1), a combination of a compound represented by $MX_2$ and a compound represented by $RNH_3X$ can be mentioned. Also, in the case where the perovskite compound is a compound represented by the general formula (2), a combination of a compound represented by $MX_2$ with one or more kinds selected from a compound represented by $R^1NH_3X$, a compound represented by $R^2NH_3X$, and a compound represented by $R^3NH_3X$ can be mentioned.

The perovskite compound in the light absorption layer can be identified by the conventional methods such as element analysis, infrared (IR) spectrum, Raman spectrum, nuclear magnetic resonance (NMR) spectrum, X-ray diffraction pattern, absorption spectrum, emission spectrum, electron microscope observation, and electron beam diffraction.

From the viewpoint of complementing the band gap energy which the perovskite compound does not have and improving the photoelectric conversion efficiency of the near-infrared light region, the quantum dot having a band gap equal to or more than 0.2 eV and equal to or less than the band gap energy of the perovskite compound is used. The quantum dots may be used singly or in combination of two or more kinds having different band gap energies. When two or more kinds of perovskite compounds having different band gap energies are used, "the band gap energy equal to or less than the band gap energy of the perovskite compound", which is the upper limit of the band gap energy of the quantum dot, means a band gap energy equal to or less than the maximum value of the band gap energy of two or more kinds of perovskite compounds.

Hereinafter, unless otherwise specified, preferred embodiments of quantum dots are preferred embodiments common to the light absorption layer and its raw materials, except for preferred embodiments of organic ligands.

From the viewpoint of improving the photoelectric conversion efficiency (voltage), the band gap energy of the quantum dot is preferably 0.8 eV or more, more preferably 0.9 eV or more, still more preferably 1.0 eV or more, even still more preferably 1.1 eV or more, and from the viewpoint of improving the photoelectric conversion efficiency (current), the band gap energy of the quantum dot is preferably 1.6 eV or less, more preferably 1.5 eV or less, still more preferably 1.4 eV or less, even still more preferably 1.3 eV or less.

Regarding the quantum dots, if the particle size and kind of quantum dots are determined by electron microscopic observation, electron beam diffraction, X-ray diffraction pattern, etc., it is also possible to calculate the band gap energy from the correlation between the particle size and the band gap energy (see, for example, ACS Nano 2014, 8, 6363-6371).

The difference between the band gap energy of the perovskite compound and the band gap energy of the quantum dot is preferably 0.4 eV or more, more preferably 0.6 eV or more, still more preferably 0.8 eV or more, and preferably 2.0 eV or less, more preferably 1.5 eV or less, still more preferably 1.3 eV or less, from the viewpoint of improving photoelectric conversion efficiency.

From the viewpoint of improving stability and photoelectric conversion efficiency, the particle size of the quantum dot is preferably 1 nm or more, more preferably 2 nm or more, still more preferably 3 nm or more, and from the viewpoint of improving film formability and photoelectric conversion efficiency, the particle size of the quantum dot is preferably 20 nm or less, more preferably 10 nm or less, still more preferably 5 nm or less. The particle size of the quantum dot can be measured by a conventional method such as crystallite diameter analysis of XRD (X-ray diffraction) or transmission electron microscope observation.

Known quantum dots can be used without particular limitation as long as they have the band gap energy mentioned above. Examples of the quantum dots having such a band gap energy include metal oxides, metal chalcogenides (such as sulfides, selenides, and tellurides), specifically PbS, PbSe, PbTe, CdS, CdSe, CdTe, $Sb_2S_3$, $Bi_2S_3$, $Ag_2S$, $Ag_2Se$, $Ag_2Te$, $Au_2S$, $Au_2Se$, $Au_2Te$, $Cu_2S$, $Cu_2Se$, $Cu_2Te$, $Fe_2S$, $Fe_2Se$, $Fe_2Te$, $In_2S_3$, SnS, SnSe, SnTe, $CuInS_2$, $CuInSe_2$, $CuInTe_2$, EuS, EuSe, and EuTe. From the viewpoint of excellent durability (oxidation resistance) and photoelectric conversion efficiency, the quantum dot preferably contains Pb element, more preferably PbS or PbSe, still more preferably PbS. In order to increase the interaction between the perovskite compound and the quantum dot, the metal constituting the perovskite compound and the metal constituting the quantum dot are preferably the same metal.

From the viewpoints of dispersibility, ease of production, cost, excellent performance expression, etc. of the quantum dots in the light absorption layer and in the dispersion, the quantum dots may contain one or more kinds selected from an organic ligand and a halogen element.

Examples of the organic ligand include a carboxyl group-containing compound, an amino group-containing compound, a thiol group-containing compound, and a phosphino group-containing compound.

Examples of the carboxyl group-containing compound include oleic acid, stearic acid, palmitic acid, myristic acid, lauric acid, capric acid, and the like.

Examples of the amino group-containing compound include oleylamine, stearylamine, palmitylamine, myristylamine, laurylamine, caprylamine, octylamine, hexylamine, butylamine and the like.

Examples of the thiol group-containing compound include ethanethiol, ethanedithiol, benzenethiol, benzenedithiol, decanethiol, decanedithiol, mercaptopropionic acid, and the like.

Examples of the phosphino group-containing compound include trioctylphosphine, tributylphosphine, and the like.

The organic ligand is preferably a carboxy group-containing compound or an amino group-containing compound, more preferably a carboxy group-containing compound, still more preferably a long chain fatty acid, even still more preferably oleic acid, from the viewpoints of ease of production, dispersion stability, versatility, cost, and excellent performance expression of the quantum dot.

In the case where the quantum dot preferably contains an organic ligand, the molar ratio of the organic ligand to the metal element constituting the quantum dot in the quantum dot used as a raw material in manufacturing the light absorption layer is preferably 0.01 or more, more preferably 0.05 or more, still more preferably 0.1 or more, even still more preferably 0.12 or more, from the viewpoint of promoting ligand exchange between the organic ligand and the precursor of the perovskite compound during production of the light absorption layer, and is preferably 1 or less, more preferably 0.8 or less, still more preferably 0.7 or less, even still more preferably 0.6 or less, from the viewpoint of improving the dispersibility of the quantum dots in the light absorption layer or in the dispersion.

When the quantum dot preferably contains an organic ligand, the molar ratio of the organic ligand to the metal element constituting the quantum dot in the light absorption layer is not particularly limited, but from the viewpoint of improving the dispersibility of quantum dots in the light absorption layer and exhibiting excellent performance, such molar ratio is preferably 0.01 or more, more preferably 0.05 or more, still more preferably 0.09 or more, even still more preferably 0.1 or more, and is preferably 1 or less, more preferably 0.8 or less, still more preferably 0.6 or less, even still more preferably 0.5 or less.

In the case where the quantum dot preferably contains an organic ligand, the molar ratio of the organic ligand contained in the quantum dot to the metal element constituting the perovskite compound in the light absorption layer is not particularly limited, but is preferably 0.001 or more, more preferably 0.005 or more, still more preferably 0.01 or more, and preferably 0.1 or less, more preferably 0.06 or less, still more preferably 0.05 or less, from the viewpoint of improving the dispersibility of quantum dots in the light absorption layer and exhibiting excellent performance.

The halogen element is not particularly limited, and examples thereof include fluorine, chlorine, bromine, and iodine. The halogen element is preferably chlorine from the viewpoints of ease of production, dispersion stability, versatility, cost, excellent performance development of quantum dots, and the like.

The atomic ratio of the halogen element to the metal element constituting the quantum dot is not particularly limited, but from the viewpoint of improving the dispersibility of quantum dots in the light absorption layer or in the dispersion, as well as from the viewpoint of suppressing the carrier transfer from the perovskite compound to the quantum dot, such atomic ratio is preferably 0.1 or more, more preferably 0.2 or more, still more preferably 0.3 or more, and preferably 1 or less, more preferably 0.8 or less, still more preferably 0.7 or less. In the light absorption layer, it is considered that the atomic ratio of the halogen element to the metal element constituting the quantum dot is almost the same as the atomic ratio of the halogen element to the metal element constituting the quantum dot in the quantum dots used as the raw material of the light absorption layer.

The quantum dots of the light absorption layer can be identified, for example, by element analysis, infrared (IR) spectrum, Raman spectrum, nuclear magnetic resonance (NMR) spectrum, X-ray diffraction pattern, absorption spectrum, emission spectrum, small angle X-ray scattering, electron microscopic observation, electron beam diffraction, and the like.

A preferable combination of the perovskite compound and the quantum dot is preferably a combination of compounds containing the same metal element from the viewpoint of achieving both durability and photoelectric conversion efficiency, for example, a combination of $CH_3NH_3PbBr_3$ and PbS, a combination of $CH_3NH_3PbBr_3$ and PbSe, a combination of $CH(=NH)NH_3PbBr_3$ and PbS, and a combination of $CH(=NH)NH_3PbBr_3$ and PbSe, and more preferably a combination of $CH_3NH_3PbBr_3$ and PbS.

The light absorption layer may contain the perovskite compound and the quantum dots, but preferably contains a complex formed of the perovskite compound and the quantum dots. By the complex formation, it is possible not only to make the quantum dots uniform in the crystal structure of the perovskite compound but also to make the interface structure between the perovskite compound and the quantum dot uniform at the atomic and molecular level, so that the effect of the present invention can be expected to be further improved. In order to form a complex by homogenizing the interface structure between the perovskite compound and the quantum dot at the atomic and molecular level, crystal lattice matching between the perovskite compound and the quantum dot is effective. For example, since $CH_3NH_3PbBr_3$ (5.92 Å) is close to PbS (5.97 Å) in the Pb—Pb atomic distance, a combination of $CH_3NH_3PbBr_3$ and PbS is preferable for forming the complex. By observation with a high-resolution transmission electron microscope (HRTEM) or the like, it can be confirmed whether the interface structure between the perovskite compound and the quantum dot is homogenized at the atomic or molecular level.

The method of forming a complex formed by the perovskite compound and the quantum dots is not particularly limited, but a method of mixing a precursor of the perovskite compound and a quantum dot in a dispersion and the like can be mentioned. The mixing method is not limited, but from the viewpoints of ease of production, cost, storage stability of the dispersion, improvement of photoelectric conversion efficiency, etc., the mixing temperature is preferably 0° C. or more, more preferably 10° C. or more, still more preferably 20° C. or more, and preferably 50° C. or less, more preferably 40° C. or less, still more preferably 30° C. or less. From the same viewpoint, the mixing time is preferably more than 0 hour, more preferably 0.1 hour or more, and preferably 72 hours or less, more preferably 24 hours or less, still more preferably 1 hour or less. From the above viewpoints, the mixing temperature is preferably 0° C. or more and 50° C. or less, more preferably 10° C. or more and 40° C. or less, still more preferably 20° C. or more and 30° C. or less, and the mixing time is preferably more than 0 hour and 72 hours or less, more preferably more than 0 hour and 24 hours or less, still more preferably 0.1 hours or more and 1 hour or less.

The content ratio of the perovskite compound and the quantum dot in the light absorption layer is not particularly limited, but the content ratio of the quantum dot to the total content of the perovskite compound and the quantum dot is preferably 0.1% by mass or more, more preferably 1% by mass or more, still more preferably 2% by mass or more, even still more preferably 4% by mass or more, from the viewpoint of improving the durability and photoelectric conversion efficiency, and preferably 10% by mass or less, more preferably 8% by mass or less, still more preferably 6% by mass or less, from the viewpoint of improving the film formability and photoelectric conversion efficiency.

The thickness of the light absorption layer is not particularly limited, but is preferably 30 nm or more, more preferably 50 nm or more, still more preferably 80 nm or more, even still more preferably 100 nm or more, from the viewpoint of increasing light absorption to improve photoelectric conversion efficiency, and preferably 1000 nm or less, more preferably 800 nm or less, still more preferably 600 nm or less, even still more preferably 500 nm or less, from the same viewpoint. The thickness of the light absorption layer can be measured by a measuring method such as electron microscope observation of the cross section of the film.

From the viewpoint of improving the strength of a hole transport material (HTM) layer, the surface smoothness of the light absorption layer is preferably 100 nm or more, more preferably 200 nm or more, still more preferably 300 nm or more, even still more preferably 400 nm or more, and from the viewpoint of improving the photoelectric conversion efficiency, the surface smoothness of the light absorption layer is preferably 1000 nm or less, more preferably 800 nm or less, still more preferably 700 nm or less. The surface smoothness of the light absorption layer can be measured by the method described in the following Examples.

The coverage of the light absorption layer to the porous layer is preferably 10% or more, more preferably 20% or more, still more preferably 30% or more, even still more preferably 40% or more, furthermore preferably 50% or more, from the viewpoint of improving the photoelectric conversion efficiency (current), and is 100% or less. The coverage of the light absorption layer to the porous layer can be measured by the method described in the following Examples.

From the viewpoint of improving the photoelectric conversion efficiency (voltage), the absorbance ratio (QD/P) of the quantum dot (QD) to the perovskite compound (P) in the light absorption layer is preferably 0.3 or less, more preferably 0.2 or less, still more preferably 0.1 or less, even still more preferably 0. The absorbance ratio (QD/P) in the light absorption layer is determined from the absorption spectrum of the light absorption layer measured by the method described in the following Example and is the ratio of the maximum absorbance of at least one kind of quantum dots to the absorbance of at least one kind of perovskite compounds. Here, the absorbance of at least one kind of quantum dot and the absorbance of at least one kind of perovskite compound are obtained respectively as the absorbance at the absorption peak position when they are measured independently.

From the viewpoint of improving photoelectric conversion efficiency (voltage), the light emission peak energy in the light absorption layer is preferably 0.2 eV or more, more preferably 0.4 eV or more, still more preferably 0.6 eV or more, even still more preferably 0.8 eV or more, when exciting the light absorption layer with light having a wavelength of 800 nm (energy 1.55 eV), and from the viewpoint of improving photoelectric conversion efficiency (current), the light emission peak energy in the light absorption layer is preferably 1.4 eV or less, more preferably 1.3 eV or less, still more preferably 1.2 eV or less, even still more preferably 1.1 eV or less.

From the viewpoint of improving photoelectric conversion efficiency, the difference between the light emission peak energy in the light absorption layer and the band gap energy of the perovskite compound is preferably 0.4 eV or more, more preferably 0.8 eV, still more preferably 1.0 eV or more, even still more preferably 1.2 eV or more, and preferably 3.4 eV or less, more preferably 2.5 eV or less, still more preferably 2.0 eV or less, even still more preferably 1.5 eV or less.

From the viewpoint of improving photoelectric conversion efficiency, the difference between the light emission peak energy in the light absorption layer and the band gap energy of the quantum dot is preferably 0.05 eV or more, more preferably 0.1 eV, still more preferably 0.2 eV or more, and preferably 1.0 eV or less, more preferably 0.5 eV or less, still more preferably 0.3 eV or less.

It is estimated that the difference (emission peak shift) between the emission peak energy in the dispersion of the quantum dots and the emission peak energy in the light absorption layer has a correlation with the distance between the particles of the quantum dots in the light absorption layer, that is, dispersibility and is preferably 0.5 eV or less, more preferably 0.4 eV or less, still more preferably 0.3 eV or less, from the viewpoint of improving the photoelectric conversion efficiency. In order to improve the dispersibility of the quantum dots in the light absorption layer, as described above, it is preferable to control the content of the organic ligand of the quantum dot, the particle size of the quantum dot, and the production method of the dispersion and the light absorption layer, within the preferred ranges.

Incidentally, as described in Examples below, the light emission peak energy in the dispersion and in the light absorption layer can be determined as the peak wavelength (peak energy) of the emission spectrum when the light absorption layer is excited with light having a wavelength of, for example, 800 nm (energy 1.55 eV).

<Photoelectric Conversion Element>

The photoelectric conversion element of the present invention has the light absorption layer. In the photoelectric conversion element of the present invention, the configuration other than the light absorption layer is not particularly limited, and a configuration of a known photoelectric conversion element can be applied. In addition, the photoelectric conversion element of the present invention can be manufactured by a known method, except for the light absorption layer.

Figure 1:
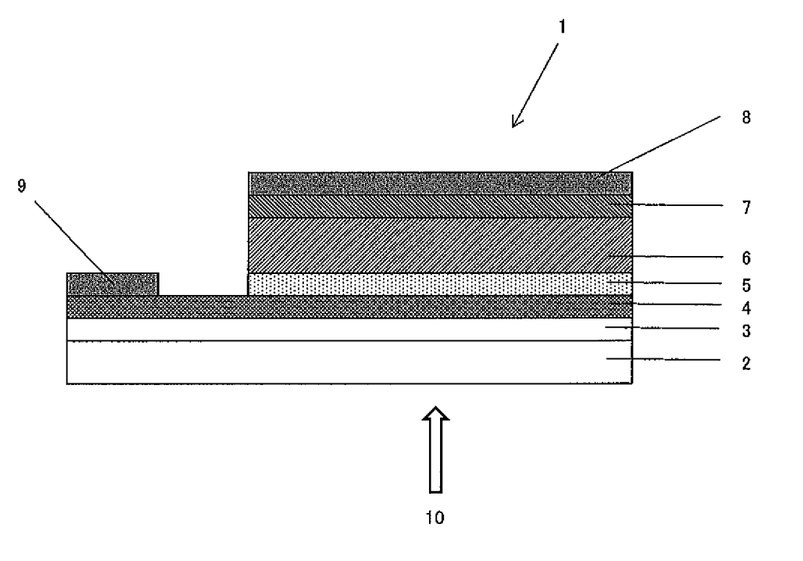
FIG. 1 is a schematic cross-sectional view showing an example of the structure of a photoelectric conversion element of the present invention.

Hereinafter, the structure and manufacturing method of the photoelectric conversion element of the present invention will be described with reference to FIG. 1, but FIG. 1 is merely an example, and the present invention is not limited to the embodiment shown in FIG. 1.

FIG. 1 is a schematic sectional view showing an example of a structure of a photoelectric conversion element of the present invention. A photoelectric conversion element 1 has a structure in which a transparent substrate 2, a transparent conductive layer 3, a blocking layer 4, a porous layer 5, a light absorption layer 6, and a hole transport layer 7 are sequentially laminated. A transparent electrode substrate on the incident side of light 10 is composed of the transparent substrate 2 and the transparent conductive layer 3, and the transparent conductive layer 3 is bonded to an electrode (negative electrode) 9 which is a terminal for electrically connecting to an external circuit. In addition, the hole transport layer 7 is bonded to an electrode (positive electrode) 8 which serves as a terminal for electrically connecting to an external circuit.

As the material of the transparent substrate 2, any material may be used as long as it has strength, durability and light permeability, and synthetic resin and glass can be used for such a purpose. Examples of the synthetic resin include thermoplastic resins such as polyethylene naphthalate (PEN) film, polyethylene terephthalate (PET), polyester, polycarbonate, polyolefin, polyimide, and fluorine resin. From the viewpoints of strength, durability, cost and the like, it is preferable to use a glass substrate.

As the material of the transparent conductive layer 3, for example, indium-added tin oxide (ITO), fluorine-added tin oxide (FTO), tin oxide ($SnO_2$), indium zinc oxide (IZO), zinc oxide (ZnO), a polymer material having high conductivity and the like can be mentioned. Examples of the polymer material include polyacetylene type polymer materials, polypyrrole type polymer materials, polythiophene type polymer materials, and polyphenylenevinylene type polymer materials. As the material of the transparent conductive layer 3, a carbon-based thin film having high conductivity can also be used. Examples of a method for forming the transparent conductive layer 3 include a sputtering method, a vapor deposition method, a method of coating a dispersion, and the like.

Examples of the material of the blocking layer 4 include titanium oxide, aluminum oxide, silicon oxide, niobium oxide, tungsten oxide, tin oxide, zinc oxide, and the like. Examples of a method for forming the blocking layer 4 include a method of directly sputtering the above material on the transparent conductive layer 3 and a spray pyrolysis method. In addition, there is a method wherein a solution in which the above material is dissolved in a solvent or a solution in which a metal hydroxide that is a precursor of a metal oxide is dissolved is coated on the transparent conductive layer 3, dried, and baked as necessary. Examples of the coating method include gravure coating, bar coating, printing, spraying, spin coating, dipping, die coating, and the like.

The porous layer 5 is a layer having a function of supporting the light absorption layer 6 on its surface. In order to increase the light absorption efficiency in the solar cell, it is preferable to increase the surface area of the portion receiving light. By providing the porous layer 5, it is possible to increase the surface area of such a light-receiving portion.

Examples of the material of the porous layer 5 include a metal oxide, a metal chalcogenide (for example, a sulfide and a selenide), a compound having a perovskite type crystal structure (excluding the light absorber described above), a silicon oxide (for example, silicon dioxide and zeolite), and carbon nanotubes (including carbon nanowires and carbon nanorods), and the like.

Examples of the metal oxide include oxides of titanium, tin, zinc, tungsten, zirconium, hafnium, strontium, indium, cerium, yttrium, lanthanum, vanadium, niobium, aluminum, tantalum, and the like, and examples of the metal chalcogenide include zinc sulfide, zinc selenide, cadmium sulfide, cadmium selenide, and the like.

Examples of the compound having a perovskite type crystal structure include strontium titanate, calcium titanate, barium titanate, lead titanate, barium zirconate, barium stannate, lead zirconate, strontium zirconate, strontium tantalate, potassium niobate, bismuth ferrate, barium strontium titanate, barium lanthanum titanate, calcium titanate, sodium titanate, bismuth titanate, and the like.

The material for forming the porous layer 5 is preferably used as fine particles, more preferably as a dispersion containing fine particles. Examples of a method for forming the porous layer 5 include a wet method, a dry method, and other methods (for example, methods described in Chemical Review, Vol. 110, page 6595 (2010)). In these methods, it is preferable to coating the surface of the blocking layer 4 with a dispersion (paste), followed by baking. By baking, the fine particles can be brought into close contact with each other. Examples of coating methods include gravure coating method, bar coating method, printing method, spraying method, spin coating method, dipping method, die coating method, and the like.

The light absorption layer 6 is the above-described Light absorption layer of the present invention. A method of forming the light absorption layer 6 is not particularly limited, and, for example, there is preferably mentioned a method based on a so-called wet process in which a dispersion containing the perovskite compound or its precursor and the quantum dots is prepared and the prepared dispersion is coated on the surface of the porous layer 5, and is dried.

In the wet process, the dispersion containing the perovskite compound or its precursor and the quantum dots preferably contains a solvent in view of film-forming property, cost, storage stability, and excellent performance (for example, photoelectric conversion property). Examples of the solvent include esters (methyl formate, ethyl formate, etc.), ketones (γ-butyrolactone, N-methyl-2-pyrrolidone, acetone, dimethyl ketone, diisobutyl ketone, etc.), ethers (diethyl ether, methyl tert-butyl ether, dimethoxymethane, 1,4-dioxane, tetrahydrofuran, etc.), alcohols (methanol, ethanol, 2-propanol, tert-butanol, methoxypropanol, diacetone alcohol, cyclohexanol, 2-fluoroethanol, 2,2,2-trifluoroethanol, 2,2,3,3-tetrafluoro-1-propanol, etc.), glycol ethers (cellosolves), amide type solvents (N,N-dimethylformamide, acetamide, N,N-dimethylacetamide, etc.), nitrile type solvents (acetonitrile, isobutyronitrile, propionitrile, methoxyacetonitrile etc.), carbonate type solvents (ethylene carbonate, propylene carbonate, etc.), halogenated hydrocarbons (methylene chloride, dichloromethane, chloroform, etc.), hydrocarbons, dimethylsulfoxide, and the like.

The solvent of the dispersion is preferably a polar solvent, more preferably at least one solvent selected from ketones, amide type solvents, and dimethylsulfoxide (DMSO), still more preferably an amide type solvent, even still more preferably N,N-dimethylformamide from the viewpoints of film forming properties, cost, storage stability, and expression of excellent performance (for example, photoelectric conversion characteristics).

In view of film-forming property, cost, storage stability, and expression of excellent performance (for example, photoelectric conversion characteristics), the metal concentration of the perovskite compound or its precursor in the dispersion is preferably 0.1 mol/L or more, more preferably 0.2 mol/L or more, still more preferably 0.3 mol/L or more, and preferably 1.5 mol/L or less, more preferably 1.0 mol/L or less, still more preferably 0.5 mol/L or less.

From the viewpoints of film-forming property, cost, storage stability, and expression of excellent performance (for example, photoelectric conversion characteristics), the solid content concentration of the quantum dots in the dispersion is preferably 1 mg/mL or more, more preferably 5 mg/mL or more, still more preferably 10 mg/mL or more, and preferably 100 mg/mL or less, more preferably 50 mg/mL or less, still more preferably 30 mg/mL or less.

The preparation method of the dispersion is not particularly limited. The specific preparation method is as described in Examples.

The coating method in the wet process is not particularly limited, and examples thereof include gravure coating method, bar coating method, printing method, spraying method, spin coating method, dipping method, die coating method, and the like.

As a drying method in the wet process, for example, a thermal drying method, an air stream drying method, a vacuum drying method and the like can be mentioned, from the viewpoints of ease of production, cost, and expression of excellent performance (for example, photoelectric conversion characteristics), and the thermal drying is preferable.

As a more detailed method of forming the light absorption layer 6 containing the perovskite compound and the quantum dots, for example, the following forming method is preferable. The specific forming method is as described in Examples.

First, a dispersion containing quantum dots in which ligands are coordinated is prepared. The ligand to be coordinated to the quantum dot is as described above.

There is no limitation on the method of coordinating the ligand to the quantum dot, but for example, nucleation and crystal growth of quantum dots are allowed to occur in the presence of a ligand, thereby to prepare quantum dots in which ligands are coordinated on the quantum dot surface.

Next, a solution containing a precursor of the perovskite compound is prepared. As the solvent, for example, N,N-dimethylformamide, dimethyl sulfoxide, γ-butyrolactone and the like can be mentioned.

Thereafter, a dispersion containing the quantum dots coordinated with the prepared ligand and a solution containing the precursor of the prepared perovskite compound are mixed to exchange the ligand of the quantum dot with the precursor of the perovskite compound, thereby to prepare a dispersion containing quantum dots in which the precursor of the perovskite compound is coordinated. Note that it is preferable that the dispersion medium of the dispersion containing the quantum dot coordinated with the ligand is not miscible with the solvent of the solution containing the precursor of the perovskite compound. Thereby, it is possible to phase-separate the solution containing the separated ligand and the dispersion containing the quantum dot coordinated with the precursor of the perovskite compound. Thus, a dispersion containing the quantum dots in which the precursor of the perovskite compound is coordinated can be extracted. The dispersion medium for the dispersion and the solvent for the solution may be selected for use from the solvents which are immiscible with each other.

The dispersion containing quantum dots in which the prepared precursor of the perovskite compound is coordinated is coated to the surface of the porous layer 5 and dried to form the light absorption layer 6. Examples of the coating method include a gravure coating method, a bar coating method, a printing method, a spray method, a spin coating method, a dipping method, a die coating method, and the like.

As a material of the hole transport layer 7, there can be mentioned, for example, a carbazole derivative, a polyarylalkane derivative, a phenylenediamine derivative, an arylamine derivative, an amino-substituted chalcone derivative, a styrylanthracene derivative, a fluorene derivative, a hydrazone derivative, a stilbene derivative, a silazane derivative, an aromatic tertiary amine compound, a styrylamine compound, an aromatic dimethylidine-based compound, a porphyrin-based compound, a phthalocyanine-based compound, a polythiophene derivative, a polypyrrole derivative, a polyparaphenylene vinylene derivative, and the like. Examples of a method for forming the hole transport layer 7 include a coating method, a vacuum vapor deposition method and the like. Examples of the coating method include a gravure coating method, a bar coating method, a printing method, a spray method, a spin coating method, a dipping method, a die coating method, and the like.

As the material of the electrode (positive electrode) 8 and the electrode (negative electrode) 9, there can be mentioned, for example, metals such as aluminum, gold, silver and platinum; conductive metal oxides such as indium tin oxide (ITO), indium zinc oxide (IZO), and zinc oxide (ZnO); organic conductive materials such as conductive polymers; and carbon-based materials such as nanotubes. Examples of a method for forming the electrode (positive electrode) 8 and the electrode (negative electrode) 9 include a vacuum vapor deposition method, a sputtering method, a coating method, and the like.

<Solar Cell>

The solar cell of the present invention has the photoelectric conversion element. In the solar cell of the present invention, the configuration other than the light absorption layer is not particularly limited, and a known solar cell configuration can be applied.

EXAMPLES

Hereinafter, the present invention will be described specifically based on Examples. Unless otherwise indicated in the table, the content of each component is % by mass. In addition, the evaluation/measurement method are as follows. In addition, unless otherwise noted, the measurement was carried out at 25° C.

<I-V Curve>

Using an I-V characteristic measuring device (PECK 2400-N, manufactured by Peccell Technologies, Inc.) with a xenon-lamp white light as a light source (PEC-L01, manufactured by Peccell Technologies, Inc.) at a light intensity (100 mW/cm$^2$) equivalent to sunlight (AM 1.5) under a mask of light irradiation area 0.0363 cm$^2$ (2 mm square), an I-V curve of the cell was measured under the conditions of a scanning speed of 0.1 V/sec (0.01 V step), a waiting time of 50 msec after voltage setting, a measurement integration time of 50 msec, a starting voltage of −0.1 V, and an ending voltage of 1.1 V. The light intensity was corrected with a silicon reference (BS-520, 0.5714 mA). The short-circuit current density (mA/cm$^2$), open circuit voltage (V), fill factor (FF), and conversion efficiency (%) were determined from the I-V curve.

<Durability>

The photoelectric conversion element was stored for 4 days under light-shielding room temperature conditions (about 25° C., humidity about 60%), and then the I-V curve was measured to obtain the conversion efficiency. The ratio of the conversion efficiency after storage to the conversion efficiency before storage was calculated.

<IPCE (Incident Photon-to-Current (Conversion) Efficiency)>

IPCE (wavelength dependence of external conversion efficiency with respect to incident light) was measured using a spectral sensitivity measuring device (CEP-2000 MLR, manufactured by Bunkoukeiki Co., Ltd.) under a mask of a light irradiation area of 0.0363 cm$^2$ in a wavelength range of 300 to 1200 nm. External quantum efficiencies at wavelengths of 400 nm and 900 nm were determined.

<Absorption Spectrum>

Using a UV-Vis spectrophotometer (SolidSpec-3700, manufactured by Shimadzu Corporation) under the conditions of a scanning speed of medium speed, a sample pitch of 1 nm, a slit width of 20, and an integrating sphere detector unit, the absorption spectrum of the light absorption layer was measured in the range of 300 to 1200 nm on a sample before applying the hole transport material. Background measurement was carried out with a fluorine-doped tin oxide (FTO) substrate (manufactured by Asahi Glass Fabritec Co., Ltd., 25×25×1.8 mm).

The absorption spectrum of the PbS quantum dot dispersion was similarly measured in a hexane dispersion having a concentration of 0.1 mg/mL of PbS quantum dot powder using a 1 cm square quartz cell.

Note that the absorption spectrum of the horizontal axis representing the wavelength λ and the vertical axis representing the absorbance A was converted into the spectrum of the horizontal axis representing the energy hν and the vertical axis representing (αhν)$^{1/2}$ (α; absorption coefficient), and a straight line was fitted to the rising part of absorption and the intersection of the straight line and the baseline was taken as the band gap energy.

<Emission Spectrum>

Using a near-infrared fluorescence spectrometer (Fluorolog, manufactured by Horiba, Ltd.), the emission spectrum of the light absorption layer was measured in the range of 820 to 1600 nm on a sample before applying a hole transport material, under the conditions of an excitation wavelength of 800 nm (Examples 1 to 3, Comparative Example 1) or an excitation wavelength of 815 nm (Comparative Examples 2 and 3), an excitation light slit-width of 10 nm, an emission slit width of 15 nm, an acquisition time of 0.1 sec, an average of two times integrations, and dark offset on.

The emission spectrum of the PbS quantum dot dispersion was similarly measured using a 1 cm square tetrahedral transparent cell in a hexane dispersion having a concentration of 0.1 mg/mL of PbS quantum dot powder.

<Surface Smoothness of Light Absorption Layer>

With respect to the surface smoothness of the light absorption layer, Ry (Rmax) after automatic tilt correction was measured at 5 points in a sample before applying a hole transport material, using a nanoscale hybrid microscope (AFM "VN-8010", manufactured by KEYENCE CORPORATION) in a DFM-H mode in a measurement range of 100 μm×75 μm, and then the average value was determined.

<Coverage of Light Absorption Layer>

The coverage of the light absorption layer was calculated from the area ratio (area rate) of the light absorption layer to the whole area by measuring the SEM photograph (enlargement magnification: 20000 times) of the surface of the light absorption layer on a sample before applying a hole transport material, using a field emission high-resolution scanning electron microscope (FE-SEM "S-4800", manufactured by Hitachi, Ltd.), and by specifying the light absorption layer with a pen tool from the SEM photograph with use of an image analysis software (Winroof).

<X-Ray Diffraction Analysis of Examples 1 and 2 and Comparative Examples 1 to 3 (Crystallinity of Light Absorption Layer)>

The crystallinity of the light absorption layer was measured in the range of 5 to 60° using a powder X-ray diffractometer (RINT 2500 VPC, light source Cu Kα, tube voltage 40 kV, tube current 120 mA, manufactured by Rigaku Corporation) under the conditions of a sampling width of 0.02°, a scanning speed of 2°/min, a divergence slit of ½°, a vertical divergence of 1.2 mm, a scattering slit of ½°, and a receiving slit of 0.15°. The crystallite diameter of the perovskite compound of the light absorption layer was calculated at the strongest peak using an analysis software (JADE).

<X-Ray Diffraction Analysis of Example 3>

The crystallite diameter of the perovskite compound of the light absorption layer was determined in the range of 5 to 60° on a sample before applying a hole transport material by using a powder X-ray diffractometer (MiniFlex 600, light source Cu Kα, tube voltage 40 kV, tube current 15 mA, manufactured by Rigaku Corporation) under the conditions of a sampling width of 0.02°, a scanning speed of 20°/min, a solar slit (incident) of 5.0°, a divergence slit of 1.250°, a vertical divergence of 13.0 mm, a scattering slit of 13.0 mm, a solar slit (reflection) of 5.0°, and a receiving slit of 13.0 mm. The crystallite diameter of the perovskite compound was calculated at the strongest peak of the perovskite compound using an analysis software (PDXL, ver. 2.6.1.2).

The crystallite diameter (particle size) of the PbS quantum dot was measured similarly in a PbS quantum dot powder on a glass holder and calculated at the cubic (220) peak (2θ=42°) of PbS using an analysis software (PDXL, ver. 2.6.1.2).

<Composition of PbS Quantum Dot Powder>

The Pb concentration in the PbS quantum dot powder was quantified by high frequency inductively coupled plasma-atomic emission spectroscopy (ICP) after completely dissolving the PbS quantum dot powder in a mixed solution of nitric acid and hydrogen peroxide.

The concentration of oleic acid anion in the PbS quantum dot powder was quantified by a proton ($^1$H) nuclear magnetic resonance (NMR) method using dibromomethane (manufactured by Wako Pure Chemical Industries, Ltd.) as an internal standard substance in a deuterated toluene (containing 99 atom % D, and TMS 0.03 vol %, manufactured by Sigma-Aldrich Japan K.K.). The measurement was carried out using an NMR apparatus (VNMRS 400 manufactured by Agilent Company) under the conditions of a resonance frequency of 400 MHz, a delay time of 60 seconds, and a 32 times-integration, and the concentration of oleate anion in the PbS quantum dot powder was determined from the ratio of the integral value of the vinyl proton (5.5 ppm vs. TMS) of the oleic acid anion to the integral value of dibromomethane (3.9 ppm vs. TMS).

The Cl concentration in the PbS quantum dot powder was quantified by photoelectron spectroscopy (ESCA) in a PbS quantum dot powder on a glass substrate. Using an ESCA device (PHI Quantera SXM, manufactured by Ulvac-Phi, Inc.), ESCA measurement was carried out under the conditions of a monochromatic Al Kα X-ray source (25 W, 15 kV), a beam diameter of 100 µm, a measurement range of 1 mm$^2$, a pass energy of 112 eV, a step of 0.2 eV, a charge correction neutralizer and an Ar$^+$ irradiation, a photoelectron take-off angle of 45°, and a binding energy correction C1s (284.8 eV), and the composition was determined from the peaks of Pb4f, S2p, and Cl2p.

<Removal Rate of Oleic Acid Anion>

The removal rate of oleic acid anion at the time of ligand exchange from the oleic acid anion of the PbS quantum dot to the perovskite raw material was determined by quantitatively determining the oleic acid concentration in the upper phase hexane solution at the ligand exchange by an NMR method, and the molar ratio of the amount of oleic acid in the hexane solution to the amount of oleic acid anion of the PbS quantum dot before the ligand exchange was calculated.

Oleic acid anion removal rate (%)=100×Amount of oleic acid in upper phase hexane solution/ Amount of oleic acid anion in PbS quantum dot before ligand exchange <Molar Ratio of Oleic Acid Anion to Pb Element Constituting PbS Quantum Dot in Light Absorption Layer>

The molar ratio of the oleic acid anion to the Pb element constituting the PbS quantum dot in the light absorption layer was calculated from the amount of the oleic acid anion in the PbS quantum dot before ligand exchange and the oleic acid anion removal rate.

Molar ratio of oleic acid anion to Pb element constituting PbS quantum dot in light absorption layer=(1−Oleic acid anion removal ratio/100)× (Molar ratio of oleic acid anion/Pb in PbS quantum dot before ligand exchange)

<Molar Ratio of Oleic Acid Anion to Pb Element Constituting Perovskite in Light Absorption Layer>

The molar ratio of the oleic acid anion to the Pb element constituting the perovskite in the light absorption layer was calculated from the amount of oleic acid anion of the PbS quantum dot before ligand exchange, the oleic acid anion removal rate, and the blend composition (the molar ratio of the Pb element constituting the PbS quantum dot to the Pb element constituting the perovskite).

Molar ratio of oleic acid anion to Pb element constituting perovskite in light absorption layer=(1−Oleic acid anion removal rate/100)×(Molar ratio of oleic acid anion/Pb in PbS quantum dot before ligand exchange)×(Molar ratio of Pb in PbS quantum dot/Pb in perovskite)

<Synthesis of PbS Quantum Dot Coordinated with Oleic Acid>

Into a 50 mL three-necked flask were placed 0.45 g of lead oxide (manufactured by Wako Pure Chemical Industries, Ltd.), 10 g of octadecene (manufactured by Sigma-Aldrich Japan K.K.) and 1.34 g of oleic acid (manufactured by Sigma-Aldrich Japan K.K.), and the mixture was stirred at 80° C. for 2 hours to prepare a Pb source solution. After evacuating the inside of the reaction system with a vacuum pump and purging with nitrogen gas, the reaction system was further stirred at 110° C. for 30 minutes. On the other hand, 210 µL of 1,1,1,3,3,3-hexamethyldisilatiane (manufactured by Tokyo Chemical Industry Co., Ltd.) was dissolved in 4 mL of octadecene to prepare an S source solution. The S source solution was injected at once with a syringe into the Pb source solution at 110° C. with stirring under nitrogen gas to produce a PbS quantum dot coordinated with oleic acid. After stopping the reaction by adding a large excess amount of acetone, the supernatant was removed by centrifugation (CR21 GIII, R15A rotor, 2,500 rpm, 2 minutes, manufactured by Hitachi Koki Co., Ltd.). After drying the precipitate, hexane was added and redispersion was performed to prepare a hexane dispersion containing PbS quantum dots coordinated with oleic acid (PbS 0.4 mass %, particle size 3.5 nm, absorption peak wavelength 940 nm, absorption edge wavelength 1050 nm, emission peak wavelength 1040 nm (excitation wavelength 800 nm)).

<Synthesis of PbS Quantum Dot Containing Cl Element>

Into a 300 mL three-necked flask were placed 8.34 g of lead chloride (99.999%, manufactured by Alfa Aesar) and 64.8 g of oleylamine (C18: 80% or more, manufactured by Acros Organics), and after evacuating the inside of the reaction system at 80° C. using a diaphragm type vacuum pump and purging with nitrogen gas, the mixture was stirred at 140° C. for 30 minutes and then cooled to 30° C. to prepare a Pb-source white turbid solution. On the other hand, 0.321 g of sulfur crystal (99.999%, manufactured by Wako Pure Chemical Industries, Ltd.) was dissolved in 8.10 g of oleylamine at 120° C. and then cooled to 80° C. to prepare an S source solution. Under a nitrogen gas atmosphere and vigorously stirring, the S source solution was injected into the Pb source white turbid solution (30° C.) using a syringe over 10 seconds to produce PbS quantum dots (black turbid liquid) containing Cl element and oleylamine. Further, after stirring for 40 seconds, 200 mL of cold hexane was added to stop crystal growth of the PbS quantum dots. After removal of the gray precipitate (lead chloride) by centrifugation (CR21 GIII, R12A rotor, 4000 rpm, 3 minutes, manufactured by Hitachi Koki Co., Ltd.), the same amount of ethanol was added to the black supernatant to obtain a black precipitate. The black precipitate (4 g) which had been dried under reduced pressure was redispersed in 100 g of hexane, and after removing the gray precipitate (lead chloride) by centrifugation, 10 g of oleic acid (90%, manufactured by Sigma-Aldrich Japan K.K.) was added to the black supernatant, then the mixture was allowed to stand for 18 hours. Further, after removal of the gray precipitate (lead chloride) by centrifugation, the same amount of ethanol was added to the black supernatant to obtain a black precipitate. After vacuum filtration (pore size: 0.2 µm, material: PTFE) and ethanol washing, the black filtrate was dried under reduced pressure to synthesize a PbS quantum dot powder in which Cl element and oleic acid anion were coordinated.

It was found that the Pb/S/Cl atomic ratio was 1/1.2/0.65 from the ESCA analysis result, the molar ratio of oleic acid anion/Pb was 0.13 from NMR and ICP analysis results, the crystallite diameter was 3.6 nm from the X-ray diffraction result, the absorption edge wavelength was 1240 nm from the absorption spectrum, and the emission peak wavelength was 1260 nm from the emission spectrum.

Example 1

The following steps (1) to (7) were carried out sequentially to prepare a cell.

(1) Etching and Cleaning of FTO Substrate

A part of a glass substrate with 25 mm square fluorine doped tin oxide (FTO) (manufactured by Asahi Glass Fabritec Corporation, 25×25×1.8 mm, hereinafter referred to as FTO substrate) was etched with Zn powder and a 2 mol/L hydrochloric acid aqueous solution. Ultrasonic cleaning was carried out for 10 minutes sequentially with 1 mass % neutral detergent, acetone, 2-propanol (IPA), and ion exchanged water.

(2) Ozone Cleaning

Ozone cleaning of the FTO substrate was performed immediately before the compact $TiO_2$ layer forming step. With the FTO side facing up, the substrate was placed in an ozone generator (ozone cleaner PC-450 UV, manufactured by Meiwafosis Co., Ltd.) and irradiated with UV for 30 minutes.

(3) Formation of Compact $TiO_2$ Layer (Blocking Layer)

Bis(2,4-pentanedionato)bis(2-propanolato) titanium (IV) (4.04 g, 75% IPA solution, manufactured by Tokyo Chemical Industry Co., Ltd.) was dissolved in 123.24 g of ethanol (anhydrous, manufactured by Wako Pure Chemical Industries) to prepare a spray solution. The spray solution was sprayed at a pressure of 0.3 MPa to an FTO substrate on a hot plate (450° C.) from a height of about 30 cm. Spraying was repeated twice on the substrates of 20 cm×8 rows to a spraying amount of about 7 g, and then the sprayed substrate was dried at 450° C. for 3 minutes. This operation was repeated twice more to spray a total of about 21 g of the spray solution. Thereafter, the FTO substrate was immersed in an aqueous solution (50 mM) of titanium chloride (manufactured by Wako Pure Chemical Industries, Ltd.) and heated at 70° C. for 30 minutes. After washing with water and drying, the FTO substrate was calcined at 500° C. for 20 minutes (temperature rising: 15 minutes) to form a compact $TiO_2$ ($cTiO_2$) layer.

(4) Formation of Mesoporous $TiO_2$ Layer (Porous Layer)

Ethanol (1.41 g, anhydrous, manufactured by Wako Pure Chemical Industries, Ltd.) was added to 0.404 g of an anatase form $TiO_2$ paste (PST-18NR, manufactured by JGC Catalysts and Chemicals Ltd.) and the mixture was subjected to ultrasonic dispersion for 1 hour to obtain a $TiO_2$ coating liquid. In a dry room, the $TiO_2$ coating liquid was spin-coated (5000 rpm×30 sec) on the $cTiO_2$ layer using a spin coater (MS-100, manufactured by Mikasa Co., Ltd.). After drying for 30 minutes on a hot plate at 125° C., the $cTiO_2$ layer was calcined at 500° C. for 30 minutes (time for temperature rising: 60 minutes) to form a mesoporous $TiO_2$ ($mTiO_2$) layer.

(5) Formation of Light Absorption Layer

The light absorption layer and the hole transport layer were formed in a glove box. Lead bromide ($PbBr_2$, a precursor for perovskite, 0.114 g, manufactured by Tokyo Chemical Industry Co., Ltd.), 0.035 g of methylamine hydrobromide ($CH_3NH_3Br$, manufactured by Tokyo Chemical Industry Co., Ltd.), and 1 mL of anhydrous N,N-dimethylformamide (anhydrous DMF, manufactured by Wako Pure Chemical Industries, Ltd.) were mixed and stirred at room temperature to prepare a DMF solution (colorless transparent) of 0.3 M bromine-based perovskite ($CH_3NH_3PbBr_3$) raw material. Under stirring at room temperature, 0.5 mL of the DMF solution of the bromine-based perovskite raw material was added to 1 mL of a hexane dispersion (PbS quantum dot powder 10 mg/mL in hexane) containing PbS quantum dots to which the oleic acid was coordinated, and the mixture was stirred for 10 minutes, then allowed to stand for 1 hour. After removal of the colorless transparent hexane solution of the upper phase, a dispersion (containing PbS in a mass ratio of 5.1% with respect to the total content of PbS and perovskite) of the lower phase containing PbS quantum dots in which the bromine-based perovskite raw material was coordinated was filtered through a PTFE filter having a pore size of 0.45 μm. The dispersion was spin-coated at 5000 rpm for 30 seconds on the $mTiO_2$ layer using a spin coater (MS-100 manufactured by Mikasa Co., Ltd.). After 20 seconds from the start of spinning, 1 mL of toluene (anhydrous, manufactured by Wako Pure Chemical Industries, Ltd.) as a poor solvent was added dropwise at once to the center portion of the spin. Immediately after spin coating, the spin-coated product was dried on a 100° C. hot plate for 10 minutes. After the contacting portion with the FTO was wiped off with a cotton swab impregnated with DMF, drying at 70° C. for 60 minutes was performed to form a light absorption layer. The light absorption layer includes a bromine-based perovskite compound $CH_3NH_3PbBr_3$ and a quantum dot PbS. The production of the perovskite compound was confirmed by X-ray diffraction pattern, absorption spectrum, and electron microscope observation, and the formation of the quantum dots was also confirmed from the fluorescence spectrum.

(6) Formation of Hole Transport Layer

Bis(trifluoromethanesulfonyl)imide lithium (LiTFSI, 9.1 mg, manufactured by Wako Pure Chemical Industries, Ltd.), 8.7 mg of [tris(2-(1H-pyrazol-1-yl)-4-tert-butylpyridine) cobalt(III) tris(bis(trifluoromethylsulfonyl)imide)] (Co(4-tButylpyridyl-2-1H-pyrazole) 3.3 TFSI, manufactured by Wako Pure Chemical Industries, Ltd.), 72.3 mg of 2,2',7,7'-tetrakis[N,N-di-p-methoxyphenylamino]-9,9'-spirobifluorene (Spiro-OMeTAD, manufactured by Wako Pure Chemical Industries, Ltd.), 1 mL of chlorobenzene (manufactured by Nacalai Tesque), and 28.8 μL of tributylphosphine (TBP, manufactured by Sigma-Aldrich) were mixed and stirred at room temperature to prepare a hole transport material (HTM) solution (black-purple transparent). Immediately before use, the HTM solution was filtered through a PTFE filter with a pore size of 0.45 μm. The HTM solution was spin-coated (4000 rpm×30 sec) on the light absorption layer using a spin coater (MS-100, manufactured by Mikasa Co., Ltd.). Immediately after spin coating, the spin-coated product was dried on a 70° C. hot plate for 30 minutes. After drying, the contact part with FTO was wiped off with a cotton swab impregnated with chlorobenzene, then the entire back surface of the substrate was wiped off with a cotton swab impregnated with DMF, further drying was performed on a hot plate at 70° C. for several minutes, thereby forming a hole transport layer.

(7) Deposition of Gold Electrode

Gold was deposited to a thickness of 100 nm on the hole transport layer (vacuum deposition rate: 8 to 9 Å/sec) under vacuum (4 to $5×10^{-3}$ Pa) using a vacuum vapor deposition apparatus (VTR-060M/ERH, manufactured by ULVAC KIKO Inc.) to form a gold electrode.

Example 2

A light absorption layer was formed in the same manner as in Example 1 to prepare a cell, except that 1 mL of the DMF solution of the bromine-based perovskite raw material was added to 1 mL of the hexane dispersion containing the PbS quantum dots to which the oleic acid was coordinated in the "(5) Formation of Light Absorption Layer" of Example 1 (the mass ratio of PbS to the total content of PbS and perovskite was 2.6%).

Example 3

A light absorption layer was formed in the same manner as in Example 1 to prepare a cell, except that 1 mL of the DMF solution of the bromine-based perovskite raw material was added to 2 mL of the hexane dispersion containing the PbS quantum dots containing the Cl element in the "(5) Formation of Light Absorption Layer" of Example 1 (the mass ratio of PbS to the total content of PbS and perovskite was 6.3%).

Comparative Example 1

A light absorption layer was formed in the same manner as in Example 1 to prepare a cell, except that the hexane dispersion containing the PbS quantum dots to which oleic acid was coordinated was not added in the "(5) Formation of Light Absorption Layer" of Example 1 (the mass ratio of PbS to the total content of PbS and perovskite was 0%).

Comparative Example 2

As in the "(5) Formation of Light Absorption Layer" of Example 1, 0.143 g of lead iodide ($PbI_2$, a perovskite precursor, manufactured by Tokyo Chemical Industry Co., Ltd.), 0.050 g of methylamine hydroiodide ($CH_3NH_3I$, manufactured by Tokyo Chemical Industry Co., Ltd.), and 1 mL of anhydrous N,N-dimethylformamide (anhydrous DMF, manufactured by Wako Pure Chemical Industries, Ltd.) were mixed and the mixture was stirred at room temperature to prepare a DMF solution (yellow transparent) of 0.3 M iodine-based perovskite ($CH_3NH_3PbI_3$) raw material. A light absorption layer was formed in the same manner as in Example 1 to prepare a cell, except that the DMF solution of the prepared iodine-based perovskite raw material was used in place of the DMF solution of the bromine-based perovskite raw material (the mass ratio of PbS to the total content of PbS and perovskite was 5.6%) in the "(5) Formation of Light Absorption Layer" of Example 1.

Comparative Example 3

A light absorption layer was formed in the same manner as in Comparative Example 2 to prepare a cell, except that the hexane dispersion containing the PbS quantum dots in which oleic acid was coordinated was not added in Comparative Example 2 (the mass ratio of PbS to the total content of PbS and perovskite was 0%).

TABLE 1

| | | | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|---|---|
| PEROVSKITE (P) | COMPOUND | | $CH_3NH_3PbBr_3$ | $CH_3NH_3PbBr_3$ | $CH_3NH_3PbBr_3$ | $CH_3NH_3PbBr_3$ | $CH_3NH_3PbI_3$ | $CH_3NH_3PbI_3$ |
| | BAND GAP ENERGY | (eV) | 2.3 | 2.3 | 2.3 | 2.3 | 1.6 | 1.6 |
| QUANTUM DOT (QD) | COMPOUND | | PbS | PbS | PbS | — | PbS | — |
| | Cl/Pb | (ATOMIC RATIO) | 0 | 0 | 0.65 | — | 0 | — |
| | OLEIC ACID ANION/Pb | (MOLAR RATIO) | 0.51 | 0.51 | 0.13 | — | 0.51 | — |
| | PARTICLE SIZE | (nm) | 3.5 | 3.5 | 3.6 | — | 3.5 | — |
| | BAND GAP ENERGY | (eV) | 1.2 | 1.2 | 1.0 | — | 1.2 | — |
| | EMISSION PEAK ENERGY IN LIQUID | (eV) | 1.2 | 1.2 | 0.98 | — | 1.2 | — |
| LIGAND EXCHANGE | BLENDING AMOUNT | (MASS %) | 5.1 | 2.6 | 6.3 | 0 | 5.6 | 0 |
| | REMOVAL RATE OF OLEIC ACID ANION | (%) | 20 | 19 | 24 | — | 49 | — |
| CELL CHARACTERISTICS | SHORT-CIRCUIT CURRENT DENSITY | (mA/cm$^2$) | 1.5 | 1.8 | 1.3 | 5.1 | 1.4 | 10.4 |
| | OPEN-CIRCUIT VOLTAGE | (V) | 0.47 | 0.52 | 0.49 | 0.64 | 0.40 | 0.66 |
| | FILL FACTOR | | 0.51 | 0.55 | 0.60 | 0.73 | 0.56 | 0.65 |
| | CONVERSION EFFICIENCY | (%) | 0.4 | 0.5 | 0.4 | 2.4 | 0.3 | 4.5 |
| | EXTERNAL QUANTUM EFFICIENCY AT 400 nm | (%) | 23 | 35 | 23 | 42 | 32 | 54 |
| | EXTERNAL QUANTUM EFFICIENCY AT 900 nm | (%) | 0.4 | 0.1 | 0.04 | 0 | 0.04 | 0 |
| | DURABILITY (CONVERSION EFFICIENCY RATIO AFTER/BEFORE STORAGE) | | 1.8 | 1.6 | 1.6 | 0.8 | 0.3 | 0.3 |
| LIGHT ABSORPTION LAYER | OLEIC ACID ANION/QUANTUM DOT Pb | (MOLAR RATIO) | 0.41 | 0.41 | 0.10 | — | 0.26 | — |
| | OLEIC ACID ANION/PEROVSKITE Pb | (MOLAR RATIO) | 0.04 | 0.02 | 0.01 | — | 0.03 | — |
| | ABSORBANCE RATIO (QD/P) | | 0 | 0 | 0 | 0 | 0 | 0 |
| | EMISSION PEAK ENERGY | (eV) | 0.93 | 0.93 | 0.93 | NONE | 0.97 | NONE |
| | EMISSION PEAK SHIFT | (eV) | 0.27 | 0.27 | 0.05 | — | 0.23 | — |
| | THICKNESS | (nm) | 200 | 200 | <100 | 200 | 100 | 100 |
| | SURFACE SMOOTHNESS | (nm) | 626 | 421 | 119 | 315 | 866 | 215 |
| | COVERAGE | (%) | 52 | 57 | 40 | 73 | 50 | 84 |
| | CRYSTALLITE DIAMETER | (nm) | 91 | >100 | 43 | >100 | 31 | 26 |

INDUSTRIAL APPLICABILITY

The light absorption layer and the photoelectric conversion element of the present invention can be suitably used as a constituent member of a next generation solar cell.

DESCRIPTION OF REFERENCE SIGNS

1 Photoelectric conversion element
2 Transparent substrate
3 Transparent conductive layer
4 Blocking layer
5 Porous layer
6 Light absorption layer
7 Hole transport layer
8 Electrode (positive electrode)
9 Electrode (negative electrode)
10 Light

The invention claimed is:

1. A light absorption layer containing
a perovskite compound having a band gap energy of 1.7 eV or more and 4.0 eV or less and
a quantum dot having a band gap energy equal to or more than 0.2 eV and equal to or less than the band gap energy of the perovskite compound,
wherein the quantum dot is dispersed in the perovskite compound, and
wherein the quantum dot contains an organic ligand,
the molar ratio of the organic ligand to a metal element constituting the quantum dot is 0.01 or more and 1 or less, and
wherein the quantum dot contains a carboxyl group-containing compound as the organic ligand.

2. The light absorption layer according to claim 1, wherein the perovskite compound is one or more kinds selected from a compound represented by the following general formula (1) and a compound represented by the following general formula (2):

$$RMX_3 \tag{1}$$

wherein R is a monovalent cation, M is a divalent metal cation, and X is a halogen anion, and $$R^1R^2R^3{}_{n-1}M_nX_{3n+1} \tag{2}$$

wherein $R^1$, $R^2$ and $R^3$ are each independently a monovalent cation, M is a divalent metal cation, X is a halogen anion, and n is an integer of 1 to 10.

3. The light absorption layer according to claim 2, wherein X is a fluorine anion, a chlorine anion, a bromine anion or an iodine anion.

4. The light absorption layer according to claim 2, wherein R is one or more kinds selected from an alkylammonium ion and a formamidinium ion.

5. The light absorption layer according to claim 2, wherein $R^1$, $R^2$, and $R^3$ are one or more kinds selected from an alkylammonium ion and a formamidinium ion.

6. The light absorption layer according to claim 2, wherein M is $Pb^{2+}$, $Sn^{2+}$, or $Ge^{2+}$.

7. The light absorption layer according to claim 1, wherein the band gap energy of the perovskite compound is 2.0 eV or more and 3.6 eV or less.

8. The light absorption layer according to claim 1, wherein the band gap energy of the quantum dot is 0.8 eV or more and 1.6 eV or less.

9. The light absorption layer according to claim 1, wherein the difference between the band gap energy of the perovskite compound and the band gap energy of the quantum dot is 0.4 eV or more and 2.0 eV or less.

10. The light absorption layer according to claim 1, wherein the quantum dot contains a metal oxide or a metal chalcogenide.

11. The light absorption layer according to claim 1, wherein the quantum dot contains Pb element.

12. The light absorption layer according to claim 1, wherein the content ratio of the quantum dots to the total content of the perovskite compound and the quantum dots is 0.1% by mass or more and 10% by mass or less.

13. A photoelectric conversion element having the light absorption layer according to claim 1.

14. A solar cell having the photoelectric conversion element according to claim 13.

* * * * *